United States Patent [19]

Agnor et al.

[11] 4,449,104
[45] May 15, 1984

[54] CIRCUIT FOR CONTROLLING THE OUTPUT LEVEL OF AN ELECTRONIC DEVICE

[75] Inventors: William C. Agnor; Edwin C. Lafferty, both of Lynchburg; Samuel Toliver, Rustburg, all of Va.

[73] Assignee: General Electric Company, Lynchburg, Va.

[21] Appl. No.: 371,074

[22] Filed: Apr. 23, 1982

[51] Int. Cl.³ .............................................. H03G 3/02
[52] U.S. Cl. ................................... 330/279; 377/126; 377/115; 330/129
[58] Field of Search ....................... 330/127, 129, 279; 307/264; 377/125, 126, 115, 116

[56] References Cited

U.S. PATENT DOCUMENTS

| Re. 30,296 | 6/1980 | Kirby et al. | 307/252 B |
| 3,663,804 | 5/1972 | Newell | 377/115 X |
| 3,895,288 | 7/1975 | Lampen et al. | 323/94 R |
| 3,968,467 | 7/1976 | Lampen et al. | 338/119 |
| 4,238,724 | 12/1980 | Klaus et al. | 323/80 |
| 4,349,779 | 9/1982 | Ono | 377/126 X |

Primary Examiner—James B. Mullins
Assistant Examiner—Steven J. Mottola
Attorney, Agent, or Firm—James J. Williams

[57] ABSTRACT

Signal level control for an amplifier or the like is provided by a binary counter which counts upward when first operated, and which thereafter counts up and down if continually operated. If the operated counter is stopped after counting up, it counts up when operated again. If the operated counter is stopped after counting down, it counts up when operated again. A digital to analog converter can provide a single control signal from the counter. The user is always assured that the single control signal will increase when the counter is operated again following a prior operation in either direction.

20 Claims, 4 Drawing Figures

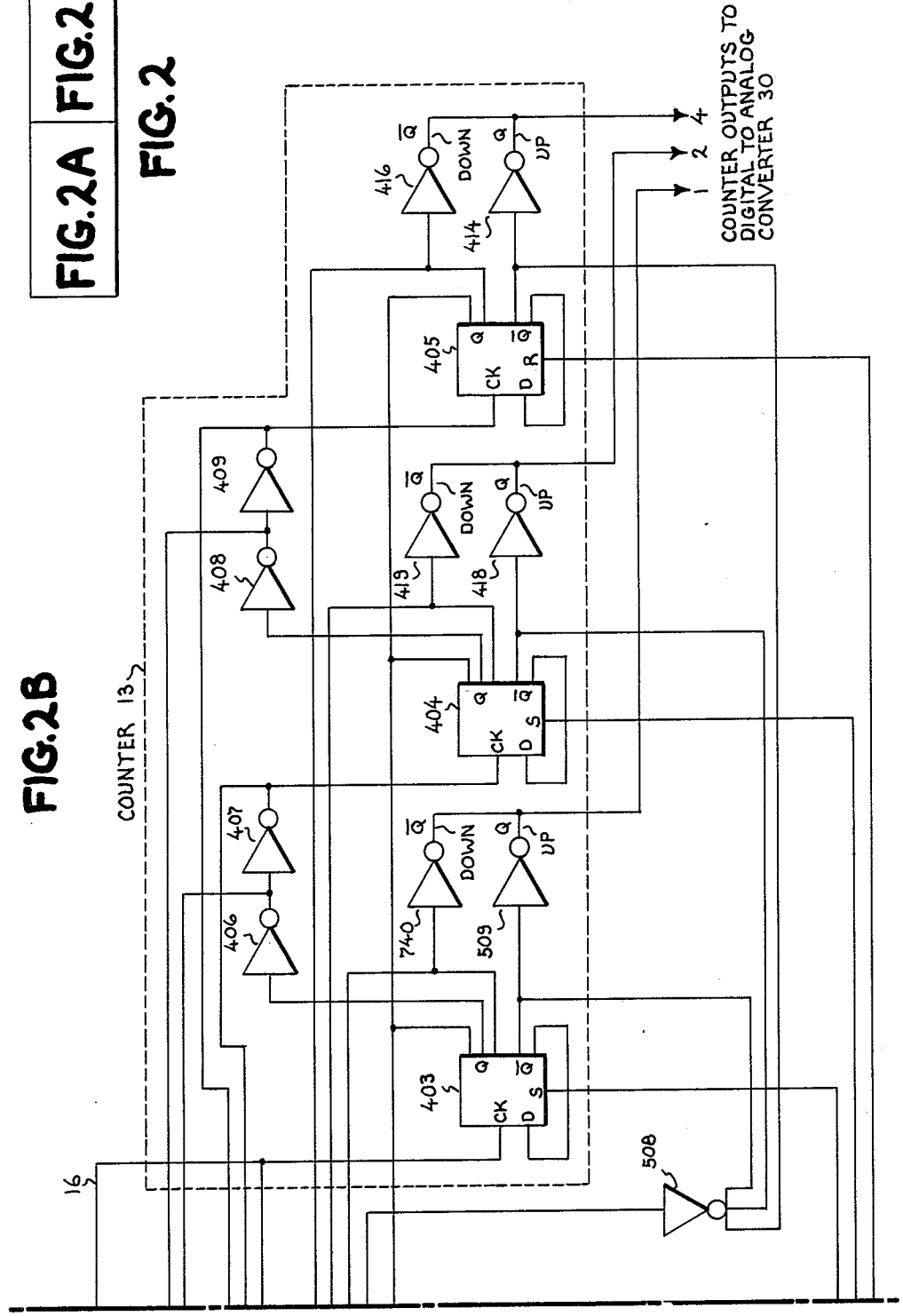

CIRCUIT FOR CONTROLLING THE OUTPUT LEVEL OF AN ELECTRONIC DEVICE

BACKGROUND OF THE INVENTION

Our invention relates to an improved circuit for controlling the output level of an electronic device, and particularly to such a circuit for replacing rotary or movable contact devices such as potentiometers or the like.

With the advance in electronic technology, electronic devices such as paging receivers are becoming very small. In fact, such devices have become so small and space so efficiently utilized that some components such as rotating potentiometers cannot be accommodated. And even if such components are accommodated, their reliability is not as good as desired or as the rest of the electronic circuits, for the reason that they are mechanical or contact devices.

SUMMARY OF THE INVENTION

Briefly, our invention includes a binary counting circuit which, when enabled, sequentially counts from an initial value to an upper value, then to a lower value, then to the upper value again, and so on as long as enabled. The counting circuit is controlled by a control circuit which insures that the counting circuit output always counts from its former value toward the upper value when the control circuit is operated. Thus, the counting circuit output always increases towards its upper value in response to each operation of the control circuit. If the output of the counting circuit is converted to a single signal, the magnitude of that signal always rises toward an upper magnitude when our control circuit is operated. The signal magnitude then falls and rises as long as our control circuit is operated. Thus, a user of our circuit knows that when our control circuit is operated, an increasing output will be provided. If this output controls the volume of a radio or some desired power device, the user will not have to wait for the output to decrease before it can increase. Our control circuit may also include means to set the count in the counting circuit at a predetermined count in response to the application of power to the associated device, thus assuring the user that the signal level will always be at the same initial point when power is applied.

BRIEF DESCRIPTION OF THE DRAWING

The subject matter which we regard as our invention is particularly pointed out and distinctly claimed in the claims. The structure and operation of our invention, as well as advantages, may be better understood from the following description given in connection with the accompanying drawing, in which:

FIGS. 2A and 2B show a schematic diagram of a preferred embodiment of our control circuit of FIG. 1.

DESCRIPTION OF THE PREFERRED EMBODIMENT

BRIEF DESCRIPTION

Figure 1:
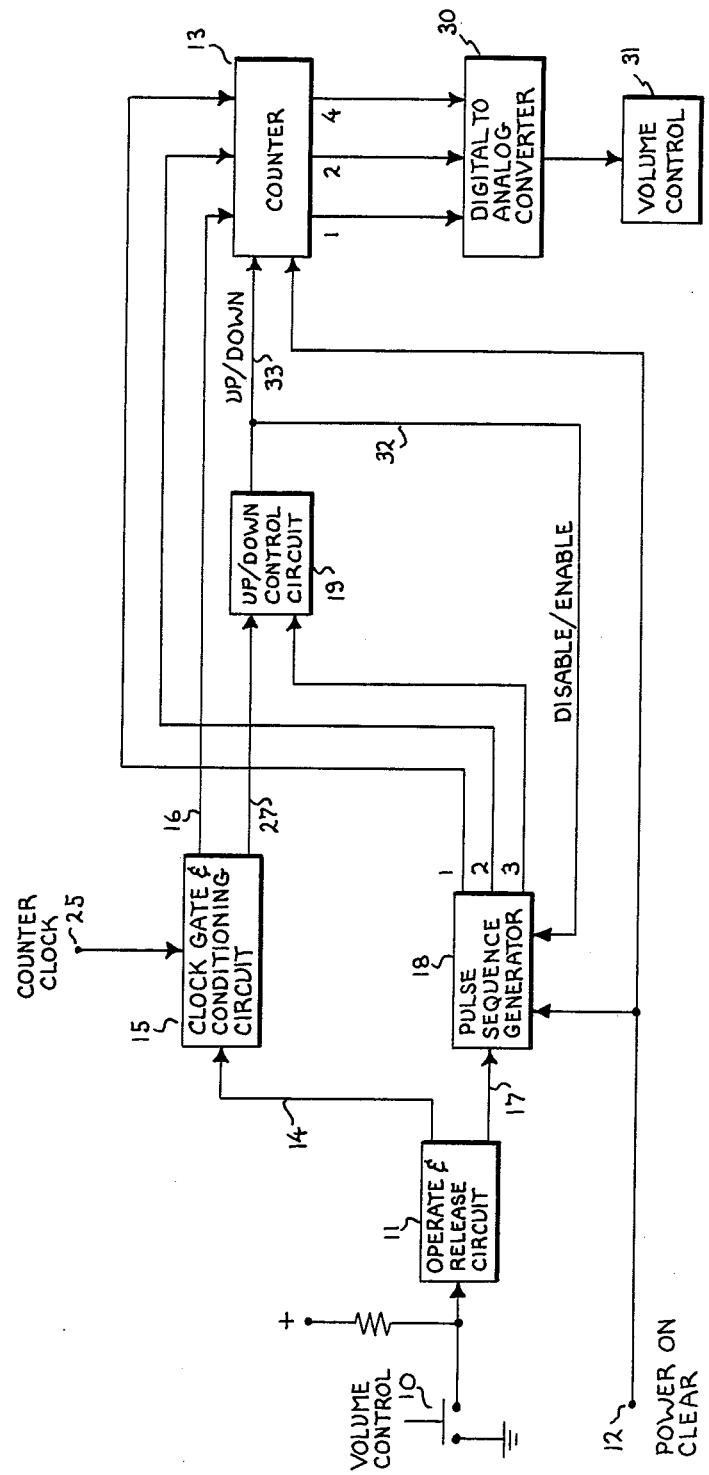
FIG. 1 shows a block diagram of a control circuit in accordance with our invention.

FIG. 1 shows a block diagram of a control circuit in accordance with our invention. As an example of the utilization of our control circuit, we have assumed that it is to be used to control the volume of a radio receiver, such as a paging receiver. As mentioned earlier, such electronic devices are very small, and all available space is utilized as efficiently as possible. This space limitation almost precludes the use of mechanical devices such as a rotary potentiometer. In addition, such devices are subject to failure because they are contact or mechanical in operation. Hence, in such a radio, mechanical devices are to be avoided as much as possible, so that an electronic control device is very desirable. And persons skilled in the art will appreciate that other devices can efficiently utilize or may even require such an electronic control device.

In such a radio, we have assumed that a volume control 10 is provided to be actuated by a user. Normally, a positive voltage (which we assume to be logic 1) is applied to an operate and release circuit 11 to hold our control circuit in a selected condition. When the volume control 10 is operated, it provides a relatively low voltage or ground (which we assume to be logic 0) to the operate and release circuit 11. This operation starts our control circuit. In addition, we prefer that a power on clear or reset signal be provided at a terminal 12 when the radio is first turned on. As known in the art, this signal provides a logic 0 for a short timed interval followed by a logic 1 in order to clear and then set our control circuit for operation. As will be explained in detail, this power on clear or reset signal sets a predetermined count in a three stage binary counter 13.

When the volume control 10 is operated or depressed, the operate and release circuit 11 produces a gating signal on a line 14 which permits our clock gate and conditioning circuit 15 to supply counter clock signals over a line 16 to the counter 13. This causes the counter 13 to count upward from its previous value to an upper level, become reset, count to the upper level again, and so on as long as the volume control 10 is depressed or operated. As the counter 13 counts, outputs are selectively derived to provide up and down counts. We have assumed that our counter 13 has three stages with binary values of 1, 2, and 4 respectively. Hence, the output of our counter 13 counts from 0 to 7, 7 to 0, and so on. (As will be explained subsequently, the internal stages of our counter 13 count from 0 to 7, are toggled back to 0, and count from 0 to 7 again.) Persons skilled in the art will appreciate that our counter 13 can have more stages or less stages. The selected outputs from the three stages are applied to a digital to analog converter 30. Signals from the converter 30 are applied to a volume control 31. The control 31 may include an amplifier whose gain or output is determined by the signals from the converter 30.

When the volume control 10 is released, the input to the circuit 11 switches from a logic 0 back to a logic 1. This causes the circuit 11 to produce a trigger signal on its output line 17 which is applied to a pulse sequence generator 18. The pulse sequence generator 18 has three outputs labeled 1, 2 and 3 which produce timed and sequential pulses in that order in response to a signal on the line 17. If the generator 18 is enabled on line 32 by an up/down control circuit 19, these pulses are applied to other parts of our circuit. If the generator 18 is disabled on line 32, the pulses are not applied to our circuit. In the enabled condition, the first pulse in the sequence is applied to the counter 13 and separates or breaks the stages of the counter 13 apart. With the stages of the counter 13 separated, the second pulse in the sequence then toggles or reverses the states of each of the stages in the counter 13 to the opposite logic condition and the counter is reconnected. The third pulse in the sequence is applied to our up/down control circuit 19 through line 3. This signal sets the control circuit 19 to the up direction. The circuit 19 supplies and up/down signal on line 33 to the counter 13. When the third pulse is supplied, the circuit 19 causes the output of the counter 13 to be derived to provide an upward count.

However, if, when the volume control 10 is released, the up/down control circuit 19 causes the counter 13 output to be derived in the upward direction, the up/down control circuit 19 produces a disable signal on line 32 that prevents the pulse sequence generator 18 from producing the sequence of three pulses. Hence, the counter 13 is left in its former condition by line 33 so that the output appears to be counting upward.

In brief summary, operation of the volume control 10 causes the counter 13 to count, and causes the counter output to be derived in an upward or increasing direction, even though the counter may, in its prior operation, have been counting downward. If the counter output had previously been in an upward direction, the output continues to appear to increase. The output continues in an increasing fashion unless the counter 13 was at the highest level when the volume control 10 was activated. If this is the case, it will maintain this level momentarily, then start to count in a decreasing fashion.

DETAILED DESCRIPTION

Figure 2A:
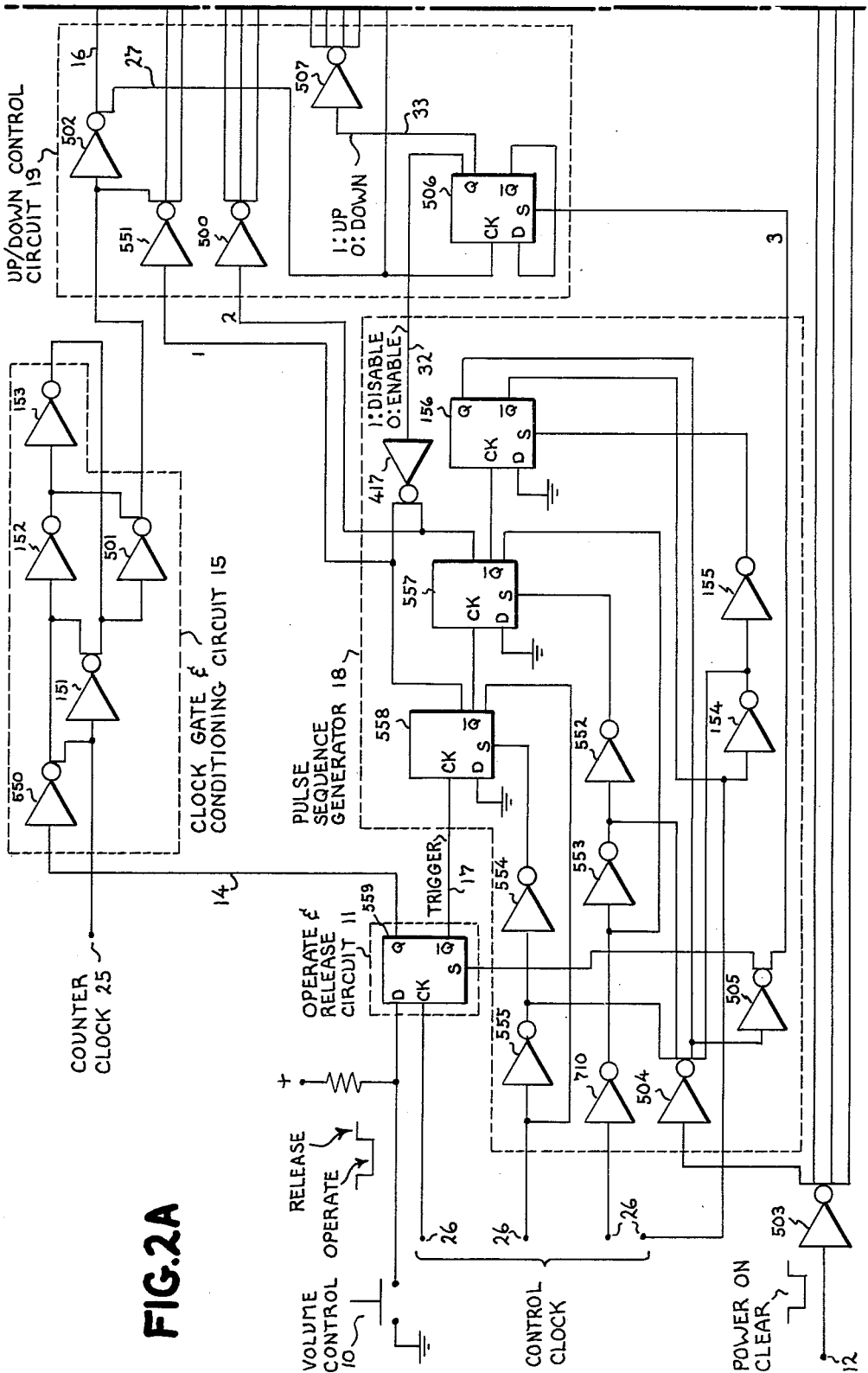

A preferred schematic diagram of our control circuit of FIG. 1 is shown in FIGS. 2A and 2B. FIGS. 2A and 2B are to be considered joined together with the leads at the right of FIG. 2A being connected or joined to the correspondingly positioned leads at the left of FIG. 2B. In FIGS. 2A and 2B, the blocks and lines of FIG. 1 have been correspondingly labeled so that the relation of FIGS. 2A and 2B to FIG. 1 can be easily determined. FIGS. 2A and 2B show our preferred embodiment in integrated injection logic ($I^2L$) form, but persons skilled in the art will appreciate that other types of logic can be used. Our circuit uses a number of D type flip-flops or multivibrators, such as the multivibrator 559 in the operate and release circuit 11. Such a flip-flop has a D input which, in response to a negative going clock pulse applied to the clock input CK, determines the Q and $\overline{Q}$ bar outputs. If the D input is at logic 1 when a negative-going clock edge is applied, the Q output becomes a logic 1 and the $\overline{Q}$ output becomes a logic 0. This is the set condition. Conversely, if the D input is at logic 0 when a negative-going clock edge is applied, the Q output becomes a logic 0 and the $\overline{Q}$ output becomes a logic 1. This is the reset condition. Such a flip-flop may also be set by applying a logic 1 to its set input S, or may be reset by applying a logic 1 to its reset input R. Our circuit uses inverters, such as the inverter 555 in the pulse sequence generator 18. Our circuit also uses wire-AND connections such as indicated by the dot with two leads to the left of the inverter 555 in the pulse sequence generator 18. All inputs of such a gate must be at logic 1 to produce a logic 1. Such a dot with an inverter is equivalent to a NAND gate.

In the operate and release circuit 11, the clock gate line 14 is derived from the Q output of the flip-flop 559, and the trigger line 17 is derived from the $\overline{Q}$ output of flip-flop 559. The line 14 is connected to the inverter 550 in the clock gate and conditioning circuit 15 to permit counter clock pulses applied to a terminal 25 to be applied to our circuit. The clock pulses are applied over the line 16 to our counter 13, and over the line 27 to our up/down control circuit 19. Control clock pulses, which may be of a different and preferably higher frequency than the counter clock pulses, are applied to four input terminals 26 shown at the left of FIG. 2A. These control clock pulses are applied to various points in our circuit for control purposes.

In the pulse sequence generator 18, the first pulse is derived from the $\overline{Q}$ output of the flip-flop 558; the second pulse is derived from the $\overline{Q}$ output of the flip-flop 557; and the third pulse is derived from the Q output of the flip-flop 156 after passing through inverter 505. Disable (logic 1) and enable (logic 0) signals are provided to the generator 18 on line 32.

In the up/down control circuit 19, the disable (logic 1) and enable (logic 0) signals and the up (logic 1) and down (logic 0) signals are derived from the Q output of the flip-flop 506, and applied to lines 32, 33. This flip-flop 506 is controlled by the Q outputs of the counter flip-flops 403, 404, 405, and inverter 502. Flip-flop 506 is also controlled by the inverter 502 over line 27. Disable and up count control is provided when the flip-flop 506 is set. Enable and down count control is provided when the flip-flop 506 is reset.

The counter 13 includes three stages of flip-flops 403, 404, 405 representing binary values of 1, 2, and 4 to provide a count of eight. If more levels are desired, added stages may be provided. Flip-flops 403, 404 are set and flip-flop 405 is reset by a power on clear signal to place an initial count of three in the counter 13. The $\overline{Q}$ outputs are coupled to the D inputs to switch the flip-flops during counting. The Q output of the flip-flop 403 is coupled through the inverters 406, 407 to the clock input CK of the flip-flop 404. The Q output of the flip-flop 404 is coupled through the inverters 408, 409 to the clock input CK of the flip-flop 405. Thus, the flip-flops count from 0 to 7, return to 0, and so on as long as clock signals are applied to the clock input CK of the 1 level flip-flop 403. Outputs for up counting are derived from the $\overline{Q}$ outputs and are inverted by inverters 509, 418, 414; and outputs for down counting are derived from the Q outputs, and are inverted by inverters 740, 419, 416. In accordance with our invention, the output which is derived depends upon the signals on the line 33 from the control circuit 19 and applied to the inverter 507, which in turn enables or disables inverters 740, 419, 416 to control the downcount signals to the digital to analog converter 30. The output of inverter 507 is also coupled to the inverter 508 which is applied to inverters 509, 418, 414 to control the upcount signals to the digital to analog converter 30. As can be seen, if the inverters controlling the upcount signals are enabled, then the inverters controlling the downcount signals are disabled, and vice versa. The outputs of these inverters are supplied to any suitable utilization circuit, such as a digital to analog converter 30 which converts the digital count in the counter to an appropriate analog signal. This signal may be either current or voltage, depending upon the desired function. And as mentioned earlier, we assume that that function is a volume control in a radio receiver. However, persons skilled in the art will appreciate the many types of circuits which can utilize these signals.

If the pulse sequence generator 18 is enabled, the first pulse is applied to the inputs of the counter inverters 407, 409 to disconnect the three stages of the counter 13.

The second pulse clocks the flip-flops 403, 404, 405 to toggle or reverse the logic of these flip-flops 403, 404, 405. The third pulse sets the flip-flop 506 to disable the generator 18 and derive up counting.

DESCRIPTION OF OPERATION

Figure 3:
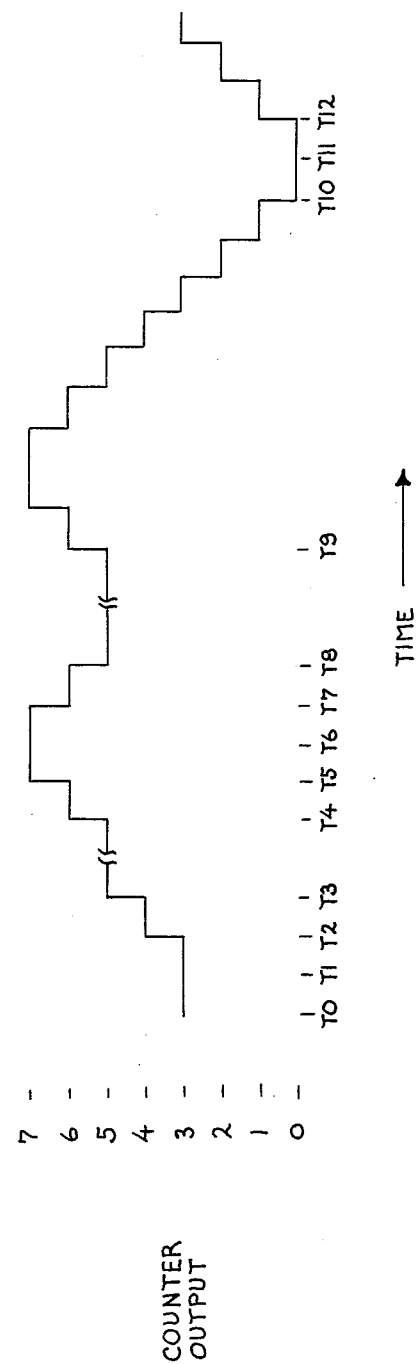
FIG. 3 shows waveforms for explaining the operation of our control circuit.

The operation of our circuit of FIGS. 2A and 2B will be explained in connection with the waveforms shown in FIG. 3 which are plotted along a common time axis. These waveforms show the total binary count derived from the counter 13 at various times as will be described. When the radio or other device is turned on, it is provided with a power on clear or reset signal at the terminal 12. This signal provides a timed logic 0 followed by a logic 1 that serves to place the circuit of FIGS. 2A and 2B in the desired condition. This logic 0 is passed by gates and inverters 503, 504, 554, 552, 155 as a logic 1 to set the flip-flops 558, 557, 156 in the pulse sequence generator 18. This logic 0 is also passed by gates and inverters 503, 504, 505 as a logic 1 to set the flip-flop 506 in the up/down control circuit 19. This logic 0 is also inverted by the inverter 503 to a logic 1 which sets the flip-flops 403, 404 and resets the flip-flop 405 in the counter 13. As indicated at the time T0 of FIG. 3, this represents a total counter output of 3. Persons skilled in the art will appreciate, of course, that other predetermined initial counts may be set up in the counter 13. We have found that a count of three represents a good average for our circuit to start from. With the flip-flop 506 set, an up count is called for. This is because the inverter 507 changes the logic 1 of the Q output on line 33 to a logic 0 which blocks the down inverters 740, 419, 416. The inverter 508 supplies a logic 1 to the up inverters 509, 418, 414 to permit these up inverters to pass signals. The Q output on line 32 from set flip-flop 506 also causes the inverter 417 to produce a logic 0 which disables the pulse sequence generator 18. At the time T1, we assume that an operator presses the volume control 10 to provide a logic 0 at the D input of the flip-flop 559 in the circuit 11. Upon the next negative-going control clock pulse, this causes the Q output to switch to a logic 0 which is applied over the line 14 to the clock gate and conditioning circuit 15. This is inverted by inverter 550 to permit counter clock pulses to be applied to the line 16. At the time T2, a counter clock pulse is applied over the line 16 to reset the flip-flop 403, which in turn resets the flip-flop 404, which in turn sets the flip-flop 405 so that the counter output produces a four.

Additional clock pulses increase the count in the counter 13 until a count of 5 is produced at the time T3. At this time, we assume the operator releases the volume control 10. This causes the operate and release circuit 11 to supply a trigger pulse to the sequence generator 18, but without effect because the generator 18 is disabled. When the operator operates the volume control 10 again at the time T4, counting in the upward direction resumes again because the control circuit flip-flop 506 is still set.

Upward count continues in response to the operated volume control until a count of 7 is produced by the Q outputs of the counter at the time T5. The Q outputs are at logic 1, and these are derived from the inverted logic 0's at the $\overline{Q}$ outputs of the flip-flops. At this time T5, the Q outputs of the flip-flops 403, 404, 405 are all at a logic 1, and this permits the next counter clock pulse at the time T6 to be applied to the clock input CK of the flip-flop 506. With its D input supplied with a logic 0 from $\overline{Q}$, this resets the flip-flop 506. Resetting of the flip-flop 506 causes its Q output to become a logic 0. This logic 0 is inverted to a logic 1 by the inverter 417 to enable the pulse sequence generator 18 to perform functions that will be described. This logic 0 is also inverted to a logic 1 by the inverter 507 to permit the down inverters 740, 419, 416 to pass signals, and is inverted a second time by the inverter 508 to block the up inverters 509, 418, 414. This same counter pulse at the time T6 resets the flip-flops 403, 404, 405 to 0 so that the flip-flop Q outputs are all at logic 0. But since the counter outputs are now derived from the down inverters 740, 419, 416, an output of 7 still appears. At the time T7, a count clock adds a first count to the flip-flops. This appears as a counter output of 6 after inversion. At the time T8, a second count is added which appears as an output of 5 after inversion. After the time T8, we have assumed that the operator releases the volume control 10.

As mentioned previously, our circuit always resumes producing an output count in the up direction after stopping, even if the down output was previously being derived from the counter 13. When the operator released the volume control 10 after the time T8, the counter output remained at 5. The up/down control circuit flip-flop 506 was previously in the reset condition for a down count so that its Q output was at a logic 0. This logic 0 is inverted by the inverter 417 to a logic 1 to enable the pulse sequence generator 18. When, after the time T8 the operator released the volume control 10, the flip-flop 559 in the operate and release circuit 11 became set. Line 14 produces a logic 1 which is inverted by the inverter 550 to block counter clock pulses. This setting also provides a trigger pulse on line 17 that resets the flip-flop 558 in the enabled sequence generator 18 (since its D input is at logic 0) to produce the first pulse on line 1. This first pulse is inverted by the inverter 551 to block the inverters 407, 409 and separate the counter stages. The inverter 551 also blocks counter clock pulses at the inverter 502. This first pulse permits the next positive-going edge of the control clock to pass through the inverters 555, 554 to set the flip-flop 558 again. And finally, this pulse resets the flip-flop 557 (since its D input is at logic 0) to produce the second pulse on line 2.

This second pulse on line 2 is inverted by inverter 500 to a logic 0 to provide a clock signal to each of the clock inputs CK of the flip-flops 403, 404, 405 in the counter 13. This clock pulse toggles or inverts the logic of the flip-flops because the Q output is fed back to the D input of each of the respective flip-flops. Thus, with the counter at a count of five (derived from $\overline{Q}$ when counting down), the second pulse toggles each flip-flop independently. This second pulse permits a subsequent negative-going control clock to pass through the inverters 710 onto 553, 552 to set the flip-flop 557 again.

This second pulse also resets the flip-flop 156 in the sequence generator 18. The Q output (logic 0) of the flip-flop 156 provides the third pulse which is inverted by the inverter 505 to a logic 1 to set the flip-flop 506 in the control circuit 19. The setting of flip-flop 506 causes the derived counter output to change from $\overline{Q}$ to Q. When the control circuit flip-flop 506 is set, it disables the sequence generator 18 and causes up signals to be derived from the counter 13. The $\overline{Q}$ output (logic 1) of the flip-flop 156 permits the next control clock to pass through the inverters 154, 155 to set the flip-flop 156 again.

At the time T9, the operator operates the volume control 10 again, and a count is added to the counters. Counting continues until a count of 7 is reached, at which time our circuit operates as described for the times T5, T6, and T7. Flip-flop 506 is reset. The counter flip-flops are reset to zero, and counting resumes, but with the counter output derived from the Q outputs of the flip-flops and inverted to provide down counting.

At the time T10, the counters reach a count of 0 (derived from $\overline{Q}$ outputs) and permit the flip-flop 506 to be set at the time T11 to permit up count outputs to be derived from Q outputs. Such a count is produced at the time T12, and continues as long as the volume control is operated and flip-flop 506 is set.

The above operation is summarized in the following table:

tor may take other forms, and of course the entire circuit may be embodied in other types of logic. Our circuit can be modified so that a down count is always produced following release after a prior down count, or following release after a prior up count. Such direction depends upon the needs of the user in a given application. Likewise, various types of digital to analog converters may be used. And finally, our circuit can be used to control all types of electrical or electronic devices. Therefore, while our invention has been described with reference to a particular embodiment, it is to be understood that modifications may be made without departing from the spirit of the invention or from the scope of the claims.

What we claim as new and desire to secure by Letters Patent of the United States is:

| Time Sequence and User Action | Counter Output Used | Count Direction | Output Logic States | | | Count Magnitude | Actions in Circuit |
|---|---|---|---|---|---|---|---|
| | | | Line 1 | Line 2 | Line 4 | | |
| T0; power on clear | Q | Up | 1 | 1 | 0 | 3 | Generator 18 enabled |
| T1; operate control 10 | | | | | | | |
| T2 | Q | Up | 0 | 0 | 1 | 4 | |
| T3 | Q | Up | 1 | 0 | 1 | 5 | |
| Release control 10 | Q | Up | 1 | 0 | 1 | 5 | |
| T4; operate control 10 | Q | Up | 0 | 1 | 1 | 6 | |
| T5 | Q | Up | 1 | 1 | 1 | 7 | |
| T6 | Q | Down | 1 | 1 | 1 | 7 | Generator 18 enabled Counter direction reversed |
| T7 | $\overline{Q}$ | Down | 0 | 1 | 1 | 6 | |
| T8 | $\overline{Q}$ | Down | 1 | 0 | 1 | 5 | |
| Release control 10 | Q | Up | 1 | 0 | 1 | 5 | Toggle counter flip-flops independently |
| T9; operate control 10 | Q | Up | 0 | 1 | 1 | 6 | |
| | Q | Up | 1 | 1 | 1 | 7 | |
| | Q | Down | 1 | 1 | 1 | 7 | Generator 18 enabled Counter direction reversed |
| | $\overline{Q}$ | Down | 0 | 1 | 1 | 6 | |
| | $\overline{Q}$ | Down | 1 | 0 | 1 | 5 | |
| | $\overline{Q}$ | Down | 0 | 0 | 1 | 4 | |
| | $\overline{Q}$ | Down | 1 | 1 | 0 | 3 | |
| | $\overline{Q}$ | Down | 0 | 1 | 0 | 2 | |
| | $\overline{Q}$ | Down | 1 | 0 | 0 | 1 | |
| T10 | Q | Down | 0 | 0 | 0 | 0 | |
| T11 | Q | Up | 0 | 0 | 0 | 0 | Generator 18 disabled Counter direction reversed |
| T12 | Q | Up | 1 | 0 | 0 | 1 | |
| | Q | Up | 0 | 1 | 0 | 2 | |

SUMMARY

It will thus be seen that we have provided a new and improved level control circuit that is in solid state form, and that requires only one operable switch. Our circuit reduces the required space for the control, and also eliminates the typical rotary or mechanical contact devices, such as potentiometers. While we have shown only one embodiment of our invention, persons skilled in the art will appreciate the many modifications that may be made. For example, the pulse sequence genera- 1. An improved signal level control circuit comprising:
   a. switch means having operated and released states;
   b. input means coupled to said switch means for producing a counting signal in response to and during the time said switch means are operated, and for producing a trigger signal in response to said switch means being released;
   c. counting means arranged to produce a sequence of up counts and a sequence of down counts alternately and repetitively in response to said counting signal;

d. control means coupling said input means to said counting means whereby said counting means produce said counts in response to said counting signal, and whereby said counting means produce a count in the same direction in response to said counting signal following said trigger signal;

e. and means coupled to said counting means for deriving an output therefrom.

2. The improved control of claim 1 and further comprising power-on control means coupled to said counting means for providing an initial count therein in response to the application of power to said circuit.

3. The improved circuit of claim 1 or claim 2 wherein said direction is initially up.

4. The improved circuit of claim 1 or claim 2 where said direction is initially down.

5. A circuit for controlling the output level of an electronic device such as an amplifier or the like comprising:

a. switch means that are normally released and that are operable;

b. an input circuit coupled to said switch means for producing a first signal in response to and for the duration of said switch means being operated, and for producing a second signal in response to said switch means being released;

c. a counting circuit for sequentially counting from an initial value to a first selected value in one direction, counting in the opposite direction to a second selected value, and repeating said sequence;

d. control means coupling said counting circuit to said input circuit to cause said counting circuit to count in said one direction toward said first selected value in response to said second signal;

e. further control means coupling said counting circuit to said input circuit to cause said counting circuit to sequentially count in response to and for the duration of said first signal;

f. and output means coupled to said counting circuit for producing an output signal that varies as a function of the count in said counting circuit.

6. The circuit of claim 5 and further comprising power-on control means coupled to said counting circuit for providing an initial count therein in response to the application of power to said electronic device or the like.

7. The circuit of claim 5 or claim 6 wherein said first selected value is a maximum and said one direction is up.

8. The circuit of claim 5 or claim 6 wherein said first selected value is a maximum and said one direction is down.

9. A circuit for controlling the output level of an electronic device such as an amplifier or the like comprising:

a. switch means having released and operated states;

b. an input circuit coupled to said switch means for producing a first signal in response to said switch means being released, and for producing a second signal in response to and for the duration of said switch means being operated;

c. a binary counting circuit comprising a plurality of coupled stages each having first and second outputs of opposite binary states;

d. gating control means coupling said counting circuit to said input circuit to cause said counting circuit to count in response to said second signal;

e. control means coupling said counting circuit to said input circuit to cause said counting circuit to assume a predetermined condition and to produce counter outputs at said first outputs or alternatively at said second outputs in response to said second signal following said first signal;

f. and means coupled to said first and second outputs for deriving signals therefrom.

10. The circuit of claim 9 wherein said control means cause said predetermined condition to be the same as the condition when said counter outputs are supplied by said first outputs, and to be the opposite of the condition when said counter outputs are supplied by said second outputs.

11. An improved counting circuit comprising:

a. a plurality of binary stages each having first and second binary conditions, and each having corresponding first outputs and corresponding second outputs;

b. means coupling the first output of each stage to an input of the next succeeding stage;

c. means for selectively blocking said coupling means and switching each stage to the opposite binary condition;

d. and means for selectively deriving outputs from said first outputs or from said second outputs.

12. A signal level control circuit comprising:

a. a switch having operated and released states;

b. a pulse sequence generator having a first input coupled to said switch, said pulse sequence generator further having an enable-disable input that determines whether said pulse sequence generator produces a sequence of pulses in response to said switch being released;

c. a counter having a plurality of coupled binary stages, each of which has first and second outputs of opposite binary characteristics;

d. first and second sets of deriving gates respectively coupled to each of said first and second counter outputs;

e. control means coupled to said first outputs of said counter, to said enable-disable input of said pulse sequence generator, and to said deriving gates for enabling said pulse sequence generator and for enabling one of said sets of deriving gates in response to a predetermined count at said first outputs of said counter, and for alternatively disabling said pulse sequence generator and for enabling the other of said sets of deriving gates in response to a predetermined count at said first outputs of said counter;

f. and means coupling said pulse sequence generator to said counter to toggle said counter in response to said sequence of pulses.

13. A circuit for controlling the output level of an electronic device such as an amplifier or the like comprising:

a. an input circuit for producing a count signal during the time said output level is to be controlled, and for producing a trigger signal at the termination of said count signal;

b. a binary counting circuit comprising a plurality of coupled stages each having first and second outputs of opposite binary states;

c. gating control means coupling said counting circuit to said input circuit to cause said counting circuit to count in response to said count signal;
d. inverting control means coupling said counting circuit to said input circuit to decouple said counting circuit stages and invert the binary states of said decoupled stages in response to said trigger signal;
e. and output control means coupling said counting circuit to said input circuit to derive counter outputs at all of said first outputs or alternatively at all of said second outputs in response to said trigger signal.

14. The circuit of claim 13 wherein said inverting control means provide said decoupling and inverting functions only in response to said counter outputs being derived from said first counter outputs.

15. The circuit of claim 13 or claim 14 wherein said output control means derive said counter outputs at said first outputs subsequent to a prior derivation at said first outputs or subsequent to a prior derivation at said second outputs.

16. A signal level control circuit comprising:
a. a switch having operated and released states;
b. a pulse sequence generator having a trigger input coupled to said switch, said pulse generator having a second input for enabling said pulse sequence generator to produce a sequence of pulses in response to said switch being released;
c. a counter having a plurality of stages, each of which has first and second outputs;
d. control means coupling said first outputs of said counter to said second input of said pulse sequence generator for enabling said pulse sequence generator in response to a predetermined count at said first outputs of said counter;
e. and means applying said pulses to said counter to toggle said counter in response to said sequence of pulses.

17. The signal level control circuit of claim 16 wherein said control means switch the derived counter outputs in response to said predetermined count at said first outputs of said counter.

18. The signal level control circuit of claim 16 or claim 17 wherein said counter is toggled in response to early ones of said pulses and wherein said control means disable said pulse sequence generator in response to a later one of said pulses.

19. A signal level control circuit comprising:
a. switch having operated and released states;
b. a pulse sequence generator having a first input coupled to said switch, said pulse sequence generator further having an enable-disable input that determines whether said pulse sequence generator produces a sequence of pulses in response to said switch being released;
c. a counter having a plurality of coupled binary stages, each of which has first and second outputs of opposite binary characteristics;
d. first and second deriving gates respectively coupled to each of said first and second counter outputs;
e. control means coupling said first outputs of said counter to said enable-disable input of said pulse sequence generator for enabling or disabling said pulse sequence generator and for enabling either said first or second deriving gates in response to a predetermined count at said first outputs of said counter;
f. and means applying said pulses to said counter to toggle said counter in response to said sequence of pulses.

20. The signal level control circuit of claim 19 wherein said control means enable said pulse sequence generator with the enabling of said first deriving gates and disable said pulse sequence generator with the enabling of said second deriving gates.

* * * * *